(12) United States Patent  (10) Patent No.: US 8,611,063 B2
So  (45) Date of Patent: *Dec. 17, 2013

(54) CURRENT LIMIT CONTROL WITH CURRENT LIMIT DETECTOR

(75) Inventor: John So, Fremont, CA (US)

(73) Assignee: Advanced Analogic Technologies Incorporated, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/715,048

(22) Filed: Mar. 1, 2010

(65) Prior Publication Data

US 2010/0149713 A1   Jun. 17, 2010

Related U.S. Application Data

(63) Continuation of application No. 11/752,049, filed on May 22, 2007, now Pat. No. 7,672,107.

(60) Provisional application No. 60/829,310, filed on Oct. 13, 2006, provisional application No. 60/912,917, filed on Apr. 19, 2007.

(51) Int. Cl.
    *H02H 9/08*      (2006.01)

(52) U.S. Cl.
    USPC ......................................................... 361/93.9

(58) Field of Classification Search
    USPC ......................................................... 361/93.9
    See application file for complete search history.

(56) References Cited

U.S. PATENT DOCUMENTS

| | | |
|---|---|---|
| 3,534,353 A | 10/1970 | Calkin et al. |
| 3,859,591 A | 1/1975 | Saunders |
| 3,892,929 A | 7/1975 | Shylo |
| 4,649,455 A | 3/1987 | Scott |
| 4,783,137 A | 11/1988 | Kosman et al. |
| 4,788,620 A | 11/1988 | Scott |
| 4,910,455 A | 3/1990 | Nadd |
| 5,254,883 A | 10/1993 | Horowitz et al. |
| 5,282,125 A | 1/1994 | Dhyanchand et al. |

(Continued)

FOREIGN PATENT DOCUMENTS

| | | |
|---|---|---|
| JP | 2228217 | 9/1990 |
| JP | 2001327086 | 11/2001 |

(Continued)

OTHER PUBLICATIONS

PCT International Search Report and Written Opinion of the International Searching Authority for International Application PCT/US2007/81276, dated Mar. 28, 2008, (8 pages).

(Continued)

*Primary Examiner* — Jared Fureman
*Assistant Examiner* — Nicholas Ieva
(74) *Attorney, Agent, or Firm* — Lando & Anastasi, LLP

(57) ABSTRACT

Devices, such as mobile devices, may be exposed to short circuit and output overload events. To protect against such events, mobile devices typically include circuitry to limit currents so as not to exceed a pre-programmed current limit. Various embodiments of the present invention include devices and methods for detecting pre-programmed current limits and for limiting currents in response to such detection. In some embodiments, both the current limit detector and the current limit controller circuitry include scaled current switches. The scaling may be substantially similar between the programmed-current limit detector and the current limit controller circuitry.

35 Claims, 4 Drawing Sheets

(56) References Cited

U.S. PATENT DOCUMENTS

| | | | |
|---|---|---|---|
| 5,331,314 | A | 7/1994 | Koch |
| 5,506,493 | A * | 4/1996 | Stengel .................. 323/223 |
| 5,955,915 | A * | 9/1999 | Edwards ................. 327/541 |
| 6,130,813 | A | 10/2000 | Kates et al. |
| 6,163,708 | A | 12/2000 | Groe |
| 6,170,241 | B1 * | 1/2001 | Shibilski et al. .............. 56/11.9 |
| 6,407,894 | B1 | 6/2002 | Bilac |
| 6,617,833 | B1 | 9/2003 | Xi |
| 6,636,025 | B1 * | 10/2003 | Irissou .................. 323/313 |
| 6,639,778 | B2 | 10/2003 | Smith |
| 6,657,906 | B2 | 12/2003 | Martin |
| 6,762,917 | B1 | 7/2004 | Verbiest et al. |
| 6,807,040 | B2 | 10/2004 | Ivanov et al. |
| 6,809,678 | B2 | 10/2004 | Vera et al. |
| 6,859,000 | B2 | 2/2005 | Kessler |
| 6,947,272 | B2 | 9/2005 | Daniels et al. |
| 6,989,981 | B2 | 1/2006 | Popescu-Stanesti et al. |
| 7,181,954 | B2 | 2/2007 | Horie |
| 7,193,474 | B2 | 3/2007 | Phillips et al. |
| 7,200,373 | B2 | 4/2007 | Dornbusch |
| 7,248,026 | B2 | 7/2007 | Ritter |
| 7,253,997 | B2 | 8/2007 | Balakrishnan et al. |
| 7,268,992 | B2 | 9/2007 | Hallak et al. |
| 7,342,761 | B2 | 3/2008 | Covault |
| 7,362,191 | B2 | 4/2008 | Chen et al. |
| 7,459,891 | B2 | 12/2008 | Al-Shyoukh et al. |
| 7,573,689 | B2 | 8/2009 | Hojo |
| 7,672,107 | B2 * | 3/2010 | So ............................... 361/93.9 |
| 7,957,116 | B2 | 6/2011 | So |
| 8,295,023 | B2 | 10/2012 | So |
| 2002/0030475 | A1 * | 3/2002 | D'Angelo ................. 323/316 |
| 2002/0181180 | A1 | 12/2002 | Ivanov et al. |
| 2002/0181181 | A1 | 12/2002 | Smith |
| 2003/0001549 | A1 | 1/2003 | Sakurai |
| 2003/0088800 | A1 | 5/2003 | Cai |
| 2003/0095368 | A1 | 5/2003 | Daniels et al. |
| 2003/0099137 | A1 | 5/2003 | Martin |
| 2004/0051582 | A1 | 3/2004 | Fan et al. |
| 2004/0075600 | A1 | 4/2004 | Vera et al. |
| 2004/0100234 | A1 | 5/2004 | Okubo et al. |
| 2004/0183510 | A1 * | 9/2004 | Sutardja et al. .............. 323/266 |
| 2005/0059359 | A1 | 3/2005 | Dornbusch |
| 2005/0152164 | A1 | 7/2005 | Balakrishnan et al. |
| 2005/0190515 | A1 | 9/2005 | Hallak et al. |
| 2005/0243894 | A1 | 11/2005 | Chen et al. |
| 2006/0162427 | A1 | 7/2006 | Horie |
| 2007/0008795 | A1 | 1/2007 | Tsukada |
| 2008/0071489 | A1 | 3/2008 | Wissel |

FOREIGN PATENT DOCUMENTS

| | | |
|---|---|---|
| JP | 2002041187 | 2/2002 |
| JP | 2003208232 | 7/2003 |
| TW | 200406966 A | 5/2004 |
| TW | 200629718 A | 8/2006 |

OTHER PUBLICATIONS

PCT International Search Report and Written Opinion of the International Searching Authority for International Application PCT/US2007/81300, dated May 5, 2008, (12 pages).

PCT International Search Report and Written Opinion of the International Searching Authority for International Application PCT/US2007/81292, dated May 7, 2008, (10 pages).

PCT International Search Report and Written Opinion of the International Searching Authority for International Application PCT/US2007/81563, dated May 7, 2008, (10 pages).

Ball, Alan, "AND8140/D: SMART HotPlug Current Limit Function", On Semiconductor, Nov. 2004—Rev. 1, 6 pages.

Bai, Hua (Walker), "Reliable, Efficient LED Backlighting for Large LCD Displays", Linear Technology Magazine, vol. XVI, No. 4, Dec. 2006, 1 page.

Gu, Wei, "Improve That Mobile Phone Camera: Replace the Anemic LED Flash With A Xenon Flashlamp and A Tiny Photoflash Capacitor Charger", Linear Technology Magazine, vol. XVI, No. 4, Dec. 2006, pp. 14-19.

AAT4620, PCMCIA Current Limit Interface, Analogic Tech, Apr. 2006, pp. 1-7.

Start-Up Current-Limiters for Supercapacitors in PDAs and Other Portable Devices, cap-XX Application Note No. 1002, Revision 2.1, Feb. 2002, cap-XX Pty. Ltd., Lane Cove, NSW, Australia, pp. 1-14.

Supplementary Search Report mailed Nov. 15, 2011 from European Patent Application No. 07854009.3 filed Oct. 12, 2007.

Notice of Allowance mailed Oct. 6, 2009 from U.S. Appl. No. 11/752,049, filed May 22, 2007.

Supplementary Search Report mailed Nov. 4, 2011 from European Patent Application No. 07844244.9 filed Oct. 12, 2007.

Supplementary Search Report mailed Nov. 4, 2011 from European Patent Application No. 07854010.1 filed Oct. 12, 2007.

Notice of Allowance mailed Dec. 11, 2008 from U.S. Appl. No. 11/752,130, filed May 22, 2007.

Notice of Allowance mailed Jan. 28, 2011 from U.S. Appl. No. 11/752,101, filed May 22, 2007.

Notice of Allowance mailed Jul. 9, 2010 from U.S. Appl. No. 11/752,101, filed May 22, 2007.

Supplementary Search Report mailed Jul. 4, 2012 from European Patent Application No. 07844333.0 filed Oct. 16, 2007.

* cited by examiner

CURRENT LIMIT CONTROL WITH CURRENT LIMIT DETECTOR

REFERENCE TO EARLIER APPLICATION

This application claims the benefit of and incorporates by reference U.S. Nonprovisional application Ser. No. 11/752,049, titled "Current Limit Control with Current Limit Detector," filed May 22, 2007, which claimed the benefit of and incorporated by reference U.S. Provisional Application Ser. No. 60/829,310, filed Oct. 13, 2006, titled "Current Limit Control with Current Limit Detector" and Ser. No. 60/912,917, filed Apr. 19, 2007, titled "Current Limit Control with Current Limit Detector" all of which are incorporated by reference herein.

FIELD OF THE INVENTION

The present invention relates generally to power management in mobile devices and more specifically to current limit controllers with an application in devices such as load switches.

BACKGROUND

Current limiting is the practice of imposing an upper limit on the current that may be delivered to a load. The typical purpose of current limiting is to protect the circuit up or downstream from harmful effects due to, for example, a short circuit. In load switch applications used in power sources and adapters, current may be limited below a load switch setting. Load switch applications include driving a power line of a universal serial bus (USB) connector to various peripheral devices. Examples of load switch devices include current limited load switch devices produced by Advanced Analogic Technologies, Inc. (Sunnyvale, Calif.) as integrated circuits (ICs) designed to protect external power ports and to extend battery life in portable electronic products. Such load switch devices operate with an integrated current limiting circuit that protects, for example, the input supply against large changes in load current which could otherwise cause the supply to fall out of regulation.

As current limited devices, load switches are able to draw current up to the load switch setting. If the current exceeds the load switch setting, the current limiting circuit in the load switch limits the current flowing through the load switch. Typically, a resistor (either external or internal to the IC) is used to set the load switch current limits. Typically, within an operating voltage range of the load switch, a single current limit is set based on the resistive value chosen by the designer. One disadvantage of using a single resistor for a wide operating voltage range (and thus a wide range of load current) is loss of accuracy. This loss may occur, because the resistive value and tolerance typically determine the level of granularity of current increments detectable.

For example, in system design, a user selects a resistor having a resistive value, $R_{SET}$. The user also defines a current limit to be associated with the resistive value, thereby establishing a one-to-one correspondence between the two parameters. The current limit is arbitrarily selectable by the designer and then controlled by a current limit controller.

Therefore, there is a need for improved design of current limit controllers. One desired aspect might be to allows for limiting the peak current that flows in a circuit so as not to exceed a predetermined current limit.

SUMMARY

The present invention is based, in part, on the foregoing observations and in accordance with its purpose various embodiments of the invention include devices and methods for limiting currents so as not to exceed a predetermined current limit. The current limit may be a user-determined current limit detected by a current limit detector. Generally, the various implementations of a device for detecting the current limit can use a single resistive device associated with a corresponding user-defined current limit. One implementation of a current limit controller includes current switches adapted to be turned ON and OFF in sequence to reduce and maintain the current in a controlled manner. The current switches may be scaled substantially the same as current switches included in the current limit detector. The proposed new implementations use an integrated circuit (IC) or a number of discrete components that are typically flexible and efficient in detecting current limits as well as limiting currents. To illustrate, a number of exemplary embodiments are explained in more detail below.

According to one embodiment, a device for controlling current limits with a current limit detector comprises: a current limit controller, a current limit detector, and a current limit portion. The current limit controller includes a current switch. The current limit detector is adapted to detect a user-defined current limit and to generate a signal associated with the user-defined current limit. The current limit portion includes an amplifier, a large scale transistor of a predetermined large scale, and a small scale transistor of a predetermined small scale. The ratio between the predetermined large and small scales is preset to control a ratio between a small scale current and a large scale current flowing to the small and large scale transistors, respectively. The small and large scale transistors are responsive to the signal from the current limit detector. The amplifier is adapted to regulate the large and small scale currents in response to a control signal from the current switch.

Such device may further include a resistor coupled to and interposed between the inputs of the amplifier and adapted to allow a differential current to flow through it. The differential current may be based on the small and large scale currents. The differential current flowing through the resistor may produce the differential input voltage. The resistor may include a current sensing resistor. The device may also include a current limit converter coupled to the output of the small scale transistor and operative to convert the small scale current to voltage.

In such device, the current limit controller may include a plurality of the current switch. The current switch may be scaled and may have a scale different from the predetermined large scale. The current limit detector may include one or more scaled current limit switches, and one of the scales of the scaled current limit switches may correspond to the scale of the current switch.

The control signal may be a sum of currents flowing through the plurality of current switches. The control signal may be associated with the user-defined current limit. Regulating the large and small scale currents may include reducing the large scale current to the user-defined current limit if the large scale current exceeds the user-defined current limit, and increasing the large scale current until it substantially reaches the user-defined current limit if the large scale current is below the user-defined current limit. The amplifier may include inputs. One of the inputs may be inverting and another one of the inputs may be non-inverting. For regulating the large and small scale currents, the amplifier may further be adapted to produce an output responsive to a differential input voltage applied at its inputs. The amplifier may be further adapted to produce an output responsive to a differential input voltage applied at its inputs.

According to another embodiment, a method for controlling current limits with a current detector comprises: receiving, at a current limit controller, a signal from a current limit detector, and controlling a current. The signal is associated with a user-defined current limit. Controlling the current is performed to maintain it substantially below the user-defined current limit. Such controlling may be performed by regulating a large scale current and a small scale current flowing to, respectively, a large scale transistor and a small scale transistor and combining to produce the current. The regulating is performed by operating one or more current switches in the current limit controller in response to the received signal.

In such method, a ratio between the small and large scale currents may be preset based on a ratio between a predetermined scale associated with the small scale transistor and a predetermined large scale associated with the large scale transistor. Regulating the large and small scale currents may include reducing the large scale current to the user-defined current limit if the large scale current exceeds the user-defined current limit, and increasing the large scale current until it substantially reaches the user-defined current limit if the large scale current is below the user-defined current limit.

In such method, regulating the large and small scale currents may further be responsive to a differential input being applied at inputs of an amplifier. The one or more current switches may be scaled. The current limit detector may include one or more scaled current limit switches, and the scales of the one or more current limit switches may correspond to respective scales of the one or more current switches.

According to yet another embodiment, a device for controlling current limits comprises: a current switch, a small scale transistor of a predetermined small scale, a large scale transistor of a predetermined large scale, and an amplifier. The small scale transistor is adapted to conduct a small scale current and is operative to interrupt conduction of the small scale current when turned OFF. The large scale transistor is adapted to conduct a large scale current and is operative to interrupt conduction of the large scale current when turned OFF. The ratio between the predetermined large and small scales is preset to control a ratio between the small and large scale currents. The small and large scale transistors and the current switch are responsive to a sequence of signal from a current limit detector. The signal is associated with a user-defined current limit. The amplifier is adapted to regulate the large and small scale currents in response to a control signal from the current switch.

In these embodiments, various possible attributes may be present. The differential input voltage may be proportional to a difference between the large and small scale currents. The differential input voltage may be proportional to a difference between the large and small scale currents. Such regulating may further be gradual or fast depending on a gain of the operational amplifier. The device may be embodied in an IC or as a functional block in an IC. Such IC may also be adapted for use in a mobile device.

These and other embodiments, features, aspects and advantages of the present invention will become better understood from the description herein, appended claims, and accompanying drawings as hereafter described.

BRIEF DESCRIPTION OF THE DRAWINGS

The accompanying drawings, which are incorporated in and constitute a part of this specification, illustrate various aspects of the invention and, together with the description, serve to explain its principles. Wherever convenient, the same reference numbers will be used throughout the drawings to refer to the same or like elements.

DETAILED DESCRIPTION

Devices, such as mobile devices, may be exposed to short circuit and output overload events. It may therefore be advantageous to protect these devices with circuitry capable of detecting current limits and of limiting their supply current in response to such detection.

Accordingly, various embodiments of the invention include devices and methods for detecting current limits and for controlling output currents so as not to exceed the detected current limits. Such devices may include current switches in both the current limit detector and the current controller circuitry. Such current switches may be scaled, and the scaling may be substantially similar in the current limit detector and the current limit controller circuitry.

Figure 1A:
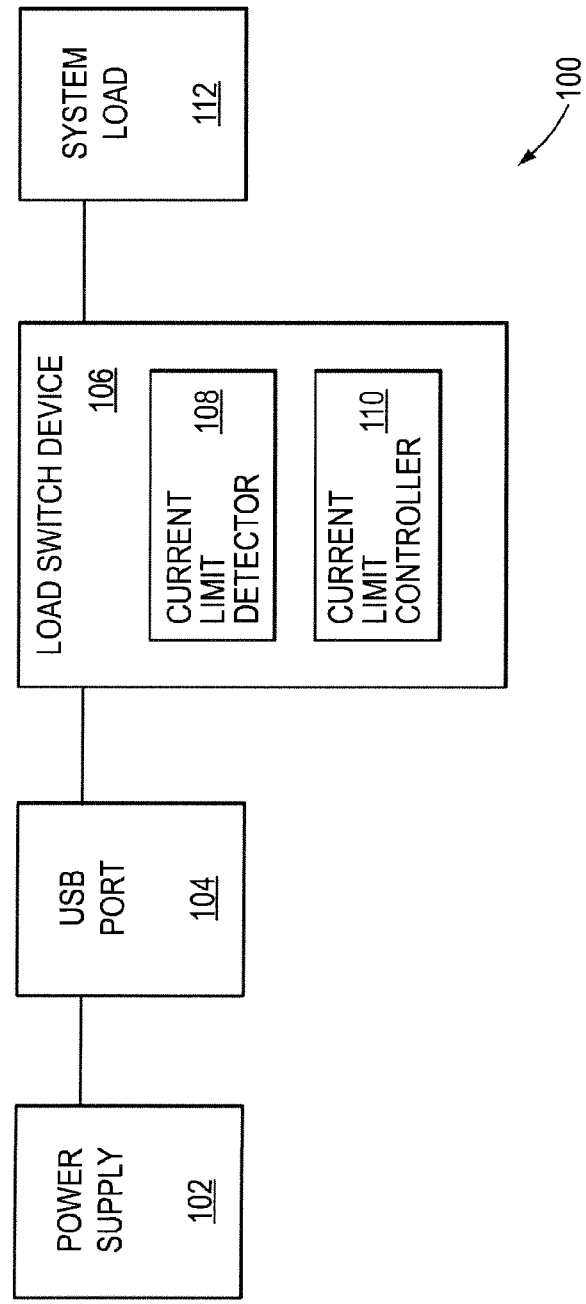
FIG. 1A is a block diagram of a load switch application, according to one embodiment of the present invention.

FIG. 1A is a block diagram showing the implementation of an application 100 with a load switch device 106, according to one embodiment of the invention. As shown, the application 100 includes a power supply 102 operatively coupled, via a universal serial bus (USB) port 104, to the load switch device 106. The load switch device 106 is in turn operatively coupled to a system load 112.

The power supply 102 is a device or system adapted to supply electrical energy to the USB port 104. Examples of power supplies 102 include batteries, direct current (DC) power supplies, chemical fuel cells, solar power, and other types of energy storage systems.

The load switch device 106 includes a current limit detector 108 and a current limit controller 110. The current limit detector 108 is operative to detect a current limit using a resistive device. The resistive device may be a resistor or any device capable of providing an electrical resistance (i.e., capable of opposing electrical current). The current limit detector 108 may include one or more comparators, resistors, and current switches (such as transistors) operatively connected and functioning to detect limits on the current. One embodiment of the current limit detector 108 is described in detail with reference to FIG. 3.

The current limit controller 110 is operative to receive the detected current limit from the current limit detector 108 and to limit the current flowing through the load switch device 106. The current limit controller 110 may include a current limit converter, an operational amplifier, a resistor (such as a current sensing resistor), and transistors operatively connected thereto.

The system load 112 may be any device connected to the output of the load switch device 106. Examples of system loads 112 include a PCMCIA card, a compact flash card, and a camera flash LED.

Figure 1B:
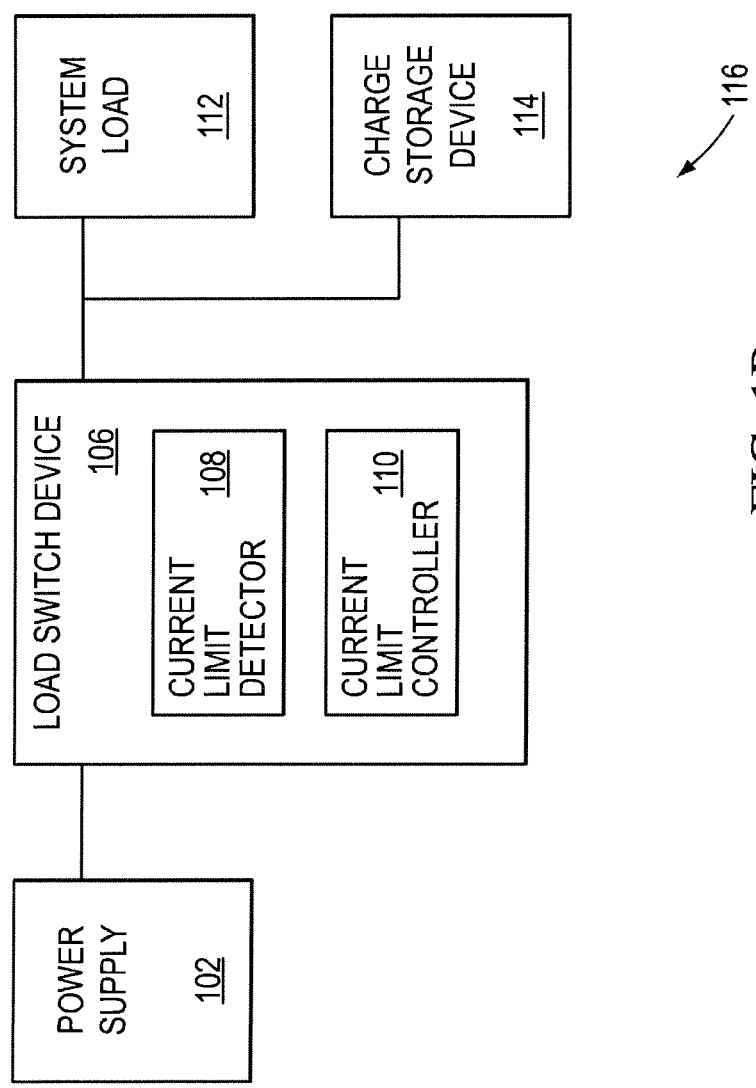
FIG. 1B is a block diagram of another load switch application, according to one embodiment of the present invention.

FIG. 1B is a block diagram of another load switch application 116, according to one embodiment of the present invention. Application 116 includes the power supply 102, the load switch device 106, the system load 112, and a charge storage device 114. The power supply 102 is operatively coupled to the load switch device 106, which is operatively coupled to both the system load 112 and the charge storage device 114. As in application 100, the load switch device 106 includes the current limit detector 108 and the current limit controller 110.

The charge storage device 114 operates as an energy reservoir adapted to supply burst power. Examples of charge storage devices 114 include boost converters and energy storage devices such as supercapacitors. Generally, a boost converter is a voltage step-up converter that is often regarded as a switching mode power supply. Energy storage devices, unlike boost converters, are based on charge storage and may be used as a power source. A supercapacitor is a type of high-energy storage device designed to be charged and recharged repeatedly and to provide instantaneous high discharge currents with rapid recharge between discharge operations. The charge storage device 114 may also include a combination of boost converter, supercapacitor, and any other type of energy storage device. In some embodiments, the charge storage device 114 may be disposed external to the load switch device 106. For example, it may be detachably coupled to the load switch device 106. In such embodiments, the charge storage device 114 is adapted to cooperate with and to supply burst power to the load switch device 106.

Figure 2:
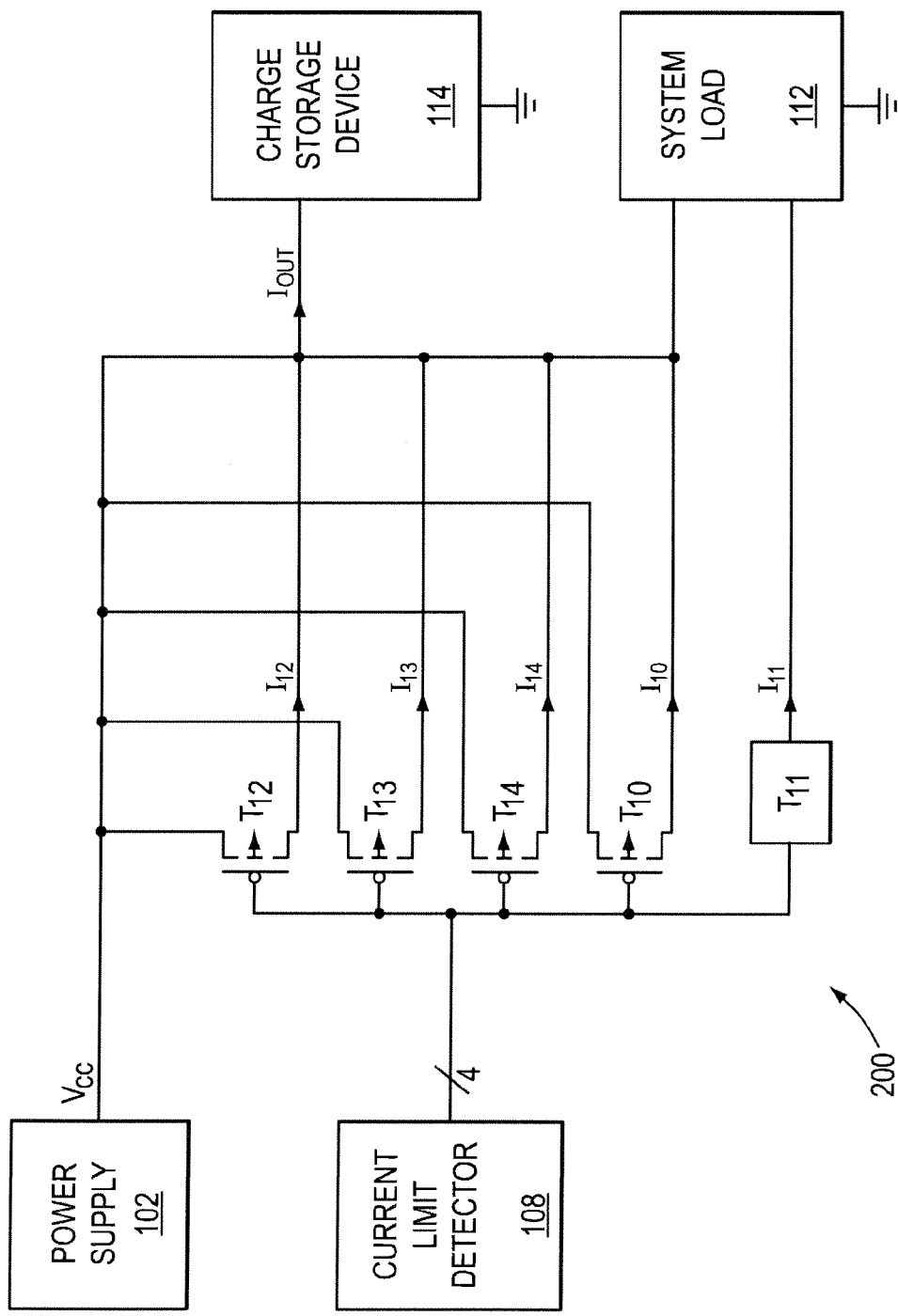
FIG. 2 is a block diagram of a load switch application, including circuit details of a current limit controller, according to one embodiment of the invention.

FIG. 2 is a block diagram of a load switch application 200, including circuit details of a current limit controller, according to one embodiment of the invention. The load switch application 200 includes the power supply 102, the current limit detector 108, current switches T10-T14, the system load 112, and the charge storage device 114. The power supply 102 is operatively coupled to T12 as well as to the system load 112 and to the charge storage device 114. The current limit detector 108 is operatively coupled to the gate of each of T10, T12-T14. The sources of T10, T12-T14 are operatively coupled to the system load 112 and to the charge storage device 114. The input of T11 is operatively coupled to the current limit detector 108, and the output of T11 is operatively coupled to the system load 112. The current switches T10-T14 may be, for example, transistors.

The current limit detector 108 is adapted to output a signal representative of the detected current limit. This signal is adapted to control which of current switches T10, T12-T14 are to be turned ON and which are to be turned OFF. The signal may include, for example, four current switch control signals, each operative to turn ON and OFF respectively T10, T12, T13, and T14. If T12 alone is turned ON, the output current, $I_{OUT}$, may be limited to the current, I12, flowing through T12. If T12 and T13 are both turned ON, $I_{OUT}$ may be limited to the sum of the current I12 and I13, and so forth. The current switch control signals may be adapted to reduce $I_{OUT}$ to substantially at or below the detected current limit in one or more steps. To that end, in one embodiment, the current limit detector 108 may include delay elements, and the number of current switch control signals may be associated with the number of delay elements. The delay elements are described in further detail with reference to FIG. 3.

The current switch T11 may be a current mirror to the current switch T10. For example, in this embodiment, the current switch T10 may be a large scale transistor adapted to conduct a large scale current I10, and the current switch T11 may be a small scale transistor adapted to conduct a small scale current I11. T10 may be scaled 1× and T11 may be scaled 0.002×. The currents I10 and I11 have a substantially fixed ratio between them determined by the size ratio of T10 and T11. That size ratio may be 500 (1/0.002=500). T10 is thus a current mirror to T11 and magnifies the small scale current, I11, by a factor of 500.

Size matching may be important to match transistor criteria, for transistor scaling (i.e., decreasing device dimensions), and the like. Transistors of a particular scale (i.e., size) are typically laid out in the same region on the integrated circuit (IC) die.

In one embodiment, the current limit detector 108 also includes current switches adapted to turn ON and OFF current paths in the current limit detector. The design of the current limit detector 108 and the current limit controller 110 may then be interrelated. For example, each current switch control signal output from the current limit detector 108 may represent a relationship between a current path in the current limit detector 108 and one of the currents I12-I14, I10. A particular current switch control signal may, for example, turn ON T10 if the corresponding current switch in the current limit detector 108 is turned ON.

In one embodiment, the current limit detector 108 may include four current paths, each including a current switch T1-T4 adapted to turn ON and OFF a current I1-I4 flowing on the respective current path. Such currents I1-I4 may be scaled in proportion to their corresponding current switches, e.g., respectively, 1×, 1×, 2×, and 4× being 1 μA, 1 μA, 2 μA, and 4 μA, respectively. In one embodiment, the current switches T10, T14, T13, and T12 may likewise be scaled 1×, 1×, 2×, and 4×. In such an embodiment, I10 may correspond to I1 (both scaled 1×), I14 to I2 (also both scaled 1×), I13 to I3 (both scaled 2×), and I14 to I2 (both scaled 4×).

In some load switch applications 200, the current limit detector 108 may be of a different implementation, for example, may not include current paths corresponding to current switches T10, T12-T14. Such embodiments may nevertheless include scaled transistors T10, T12-T14, each responsive to the current switch control signals output from the current limit detector 108. The correspondence between the current switch control signals and the respective current switch T10, T12-T14, to be turned ON and OFF in response thereto may in such embodiments be user defined.

Figure 3:
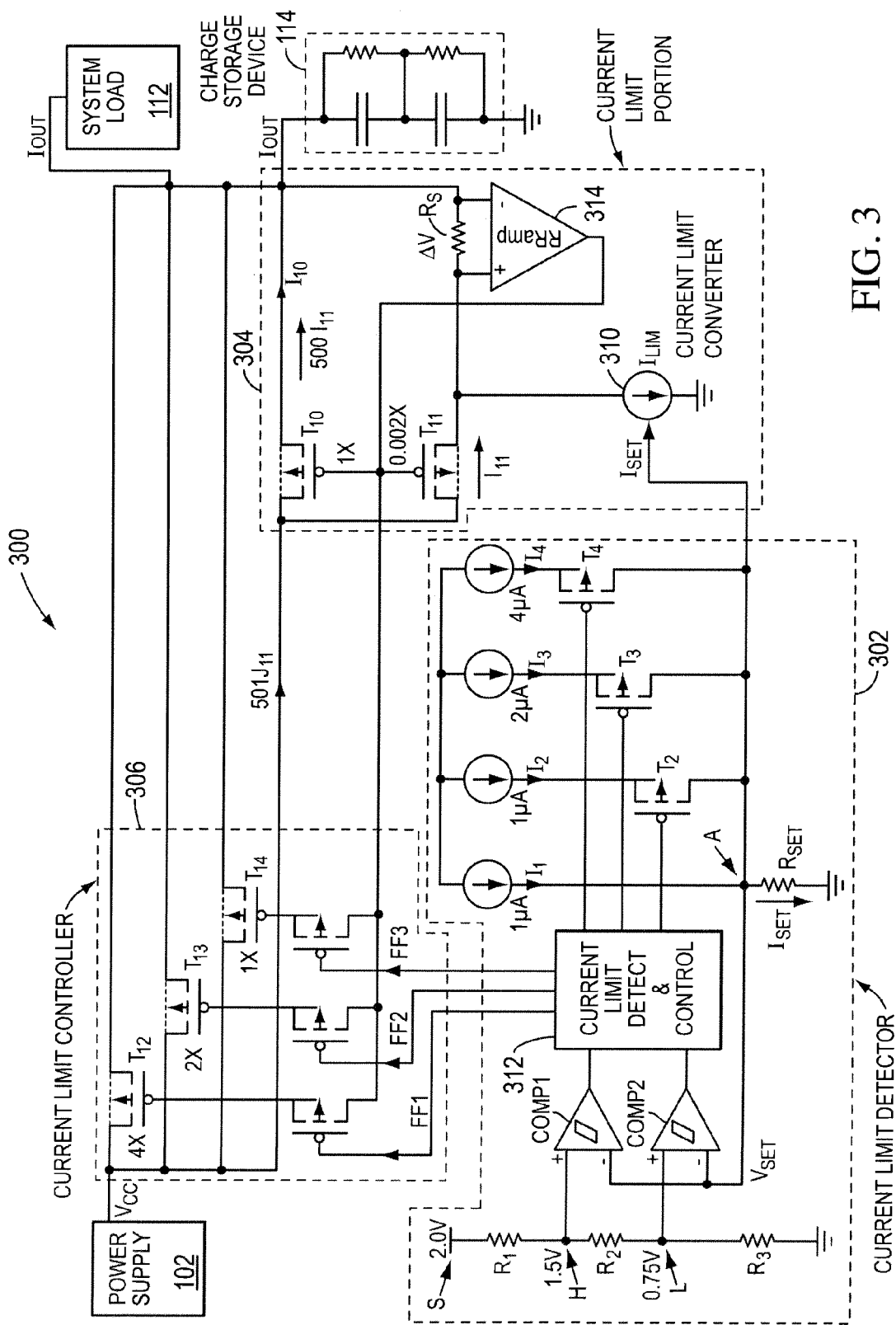
FIG. 3 illustrates circuit details of a load switch device, according to one embodiment of the present invention.

FIG. 3 illustrates circuit details of a load switch device 300, according to one embodiment of the present invention. The load switch device 300 comprises a current limit detector 302, a current limit portion 304, a current limit controller 306, the system load 112, and the charge storage device 114.

The current limit converter 310 is operative to convert voltage to current. The current limit converter 310 may be used to charge circuits as shown in FIG. 3 or any load switch device.

The current limit controller 306 is operatively coupled to the current limit detector 302, to the current limit portion 304, as well as to the system load 112 and the charge storage device 114. The current limit controller 306 is operative to, upon receiving the detected current limit from the current limit detector 302, control the current, $I_{OUT}$, output to the system load 112 and to the charge storage device 114 so as not to exceed the detected current limit. Such limitation may be performed in a controlled manner, for example, in incremental steps, substantially as described with reference to FIG. 2. Such manner may be gradual or fast depending on, for example, the number of delay elements included in the current limit detector 302 as further described below. The current limit controller 306 may include scaled transistors T12, T13, and T14 (FIG. 2). In this embodiment, T12 is scaled 4×, T13 is scaled 2×, and T14 is scaled 1×. The size ratio between the scaled transistors may correspond to the respective ratios of the current switches T1-T4. For example, T12 may be scaled 4× corresponding to the scaling of T4 relative to T1 (4 μA vs. 1 μA).

The current limit portion 304 includes the current limit converter 310, an operational amplifier 314, transistors T10 and T11, and a current sensing resistor $R_S$. The transistors T10 and T11 are scaled. In this embodiment, T10 is scaled 1× and T11 is scaled 0.002×.

In operation, if the current, I11, flowing through T11 is greater than the current limit, $I_{LIM}$, of the current limit converter 310, the operational amplifier 314 tries to reduce the current until I11 substantially equals $I_{LIM}$. If I11 is below $I_{LIM}$, the operational amplifier 314 substantially maintains I11 at or below $I_{LIM}$. The value of $I_{LIM}$ may be, for example 500×I11.

In the illustrated embodiment, $R_S$ is connected between the inverting and the non-inverting inputs of the operational amplifier 314. As described, the operational amplifier 314 receives I11 at its non-inverting input and I10 (e.g., $I_{OUT}$ of FIG. 2) at its inverting input. The differential input voltage to the operational amplifier 314 is therefore $R_S \times$(I11-I10). The operational amplifier 314 is operative to output a current responsive to the differential input voltage. Such output current is fed back to the respective gates of T10 and T11.

The current limit control portion 304 in conjunction with the current limit controller 306 essentially perform the function of a pass element. Generally, a pass element is a controlled variable resistance device. It may be driven by an amplified error signal and be operative to increase its resistance when the output current, $I_{OUT}$, is to be lowered and to decrease its resistance when the output current is to be raised. As may be seen from FIG. 3, the error signal may be the difference between currents I11 and I10. The amplification of such error signal may be performed via the gain of the operational amplifier 314 alone or in combination with the size ratio of T10 and T11. Whether the output current is to be raised or lowered depends on the relationship between the current limit, $I_{LIM}$, flowing to the current limit converter 310 and the small scale current, I11.

Briefly, if the small scale current, I11, is greater than the current limit, $I_{LIM}$, the operational amplifier 314 tries to reduce the current until I11 substantially equals $I_{LIM}$. The reduction may be obtained by turning OFF the small scale transistor T11. If I11 is below $I_{LIM}$, the operational amplifier 314 substantially maintains I11 at or below $I_{LIM}$. Such maintaining may be obtained by turning both transistors T10 and T11 ON, resulting in a higher current.

More specifically, if the small scale current, I11, is greater than the current limit, $I_{LIM}$, the balance of current (i.e., I11-I10) flows via $R_S$. The differential input voltage to the operational amplifier becomes (I11-I10)×$R_S$, which triggers the operational amplifier 314 to reduce the current until I11 substantially equals $I_{LIM}$. The output current from the operational amplifier 314 thus causes the transistor T11 to be turned OFF, which reduces the current output from T11. This reduction may occur gradually or fast depending on, at least in part, the gain of the operational amplifier 314. In some embodiments, a faster turn-off may be advantageous.

If I11 is below $I_{LIM}$, the output current from the operational amplifier 314 may cause T10 and T11 to be turned ON, thereby exhibiting low resistance and in turn increasing I11. This may cause I11 to be substantially maintained at or below $I_{LIM}$. The value of $I_{LIM}$ may be, for example, 500×I11. The net effect is that the load switch device 300 regulates the current to decrease to $I_{LIM}$ and to thereafter remain substantially at or below $I_{LIM}$.

The output current is thus controlled by the current limit controller 306 so as not to exceed the detected current limit. The current limit is detected by the current limit detector 302 and may be a user-defined current limit. The user-defined current limit may be chosen based on, for example, a predetermined power limit value of power dissipated across the pass element 304, 306. Collectively, the elements of the load switch device 300 cooperate to control the power and thus the current flowing in the pass element 304, 306 (i.e., currents I10, I11), which in turn regulates the output current, $I_{OUT}$, flowing to the system load 112, the charge storage device 114, or both.

The resistor, $R_S$, may be a current sensing resistor adapted to translate current into a voltage. In general, current sensing resistors are designed for low resistance so as to minimize power consumption. The calibrated resistance senses the current flowing through it in the form of a voltage drop, which may be detected and monitored by control circuitry (e.g., by the operational amplifier 314).

The current limit detector 302 may be substantially similar to the current limit detector 108 of FIGS. 1A-B, 2. The current limit detector 302 may be implemented in various ways. Circuit details of one implementation 302 are shown in FIG. 3. Such implementation includes two comparators COMP1, COMP2, a current limit detect and control component 312, four current paths I1-I4, three current switches T2-T4, three resistors R1-R3, a supply voltage terminal, S, a low reference voltage terminal, L, a high reference voltage terminal, H, and a resistive device, $R_{SET}$. Such implementation 302 may be designed to improve the accuracy of the current limit detector in a particular operating voltage range by magnifying the entire operating voltage range.

In one embodiment, as illustrated in Table 1, the operating voltage range is 0.75 V to 1.5 V. Table 1 illustrates the relationship between a resistive value of a resistive device, $R_{SET}$, and a corresponding user-defined current limit. By increasing the resistive value by four orders of magnitude ($2^4$=16), from 93.75 kΩ to 1.5 MΩ, the current limit is likewise increased by a magnitude of four, from 75 mA to 1.2 A.

TABLE 1

Relationship between resistive value and corresponding user-defined current limit.

| Signal | $I_{SET}$ | User-Defined Current Limit | $R_{SET}$ | $V_{SET}$ = $I_{SET} \times R_{SET}$ |
|---|---|---|---|---|
| EN8 = S1 | 1 µA | 1.2 A | 1.5 MΩ | 1.5 V |
|  | 1 µA | 600 mA | 750 kΩ | 0.75 V |
| EN4 = S1 + S2 | 2 µA | 600 mA | 750 kΩ | 1.5 V |
|  | 2 µA | 300 mA | 375 kΩ | 0.75 V |
| EN2 = S1 + S2 + S3 | 4 µA | 300 mA | 375 kΩ | 1.5 V |
|  | 4 µA | 150 mA | 187.5 kΩ | 0.75 V |
| EN1 = S1 + S2 + S3 + S4 | 8 µA | 150 mA | 187.5 kΩ | 1.5 V |
|  | 8 µA | 75 mA | 93.75 kΩ | 0.75 V |

The range is divided into multiple segments. In each segment, a user-defined resistive value, $R_{SET}$, is associated with a user-defined current limit. Although there are multiple segments, each with the same operating voltage range, a one-to-one relationship is maintained between the chosen resistive value and the defined current limit.

In a first segment, the system designer has selected a resistive value of 93.75 kΩ to be associated with a current limit of between 75 mA and 150 mA. In a second segment, a resistive value of 187.5 kΩ has been selected to be associated with a current limit of between 150 mA and 300 mA. The resistive values and associated current limits are user-defined and may be chosen according to any scheme so long as there is no overlap between segments, i.e., so long as the one-to-one relationship is maintained between $R_{SET}$ and the current limit. This enables proper transition between segments. In Table 1, for each segment, the resistive value as well as the current limit is doubled. In other embodiments, as between segments, the resistive value, the current limit or both may be logarithmically or exponentially related. For example, the first and second segments may include $R_{SET}$ of ln(93750) and ln(187500) Ω, respectively. The associated current limits may be selected according to a logarithmic pattern, any other patterns, or even randomly. By magnifying the operating voltage range, and hence also the operating current range, the resolution and accuracy may be increased.

In operation, typically upon power-up, a load switch device that includes a current limit detector scheme according to Table 1 will detect the current limit. Assume, for example, that the resistive value is 1.5 MΩ. At start-up, the current, $I_{SET}$, flowing through the current limit detector may be such that the voltage, $V_{SET}=R_{SET}\times I_{SET}$, is greater than the upper operating voltage, i.e., greater than 1.5 V. If so, the current limit detector may respond by reducing the current, $I_{SET}$. Such reduced current flowing through the current limit detector may nonetheless produce a voltage, $V_{SET}$, across the resistive device that is greater than 1.5 V. If so, the current, $I_{SET}$, may be reduced further. Once the voltage produced is below 1.5 V, the current is not reduced further, because the current limit detector is then operating within the operating voltage range. At such time, the current, $I_{SET}$, indicates what the corresponding current limit is, i.e., based on the relationship between $I_{SET}$ and the current limit, determination of $I_{SET}$ also establishes the current limit. The current limit may, for example, have been stored into memory within the load switch device. The current limit thus detected may then be communicated to a current limit controller coupled to the current limit detector. The current limit controller may thereafter limit the current to below the current limit and maintain it at or below that level.

The current limit is typically detected once after installation or set-up of the system or device in which the load switch device is incorporated or to which it is otherwise operationally coupled. Thereafter, the current limit is typically not detected anew until power is recycled, for example, when the load switch application is re-started, such as upon power-up, wake-up, and the like. Then, the current limit detector is typically dormant, i.e., not performing its current detection functionality.

The total detection current, $I_{SET}$, flowing through the load switch device may be changed in one or more steps. The embodiment illustrated in Table 1 allows for step-wise detecting the current limit by step-wise decreasing the total current flowing. Such step-wise detection may be obtained by including multiple current paths in the load switch device, where $I_{SET}$ comprises the sum of the currents flowing on each of the current paths. Also, each current path may include a current switch (e.g., a transistor T1, T2, T3, T4) which can cause the current on that path to start or stop flowing as the respective transistor is turned ON or OFF. The embodiment outlined in Table 1 includes four current paths. The signals to turn ON the transistors (T1, T2, T3, and T4) are denoted S1, S2, S3, and S4, respectively. A state of the load switch device is the status of the signals controlling the transistors, i.e., the set {S1, S2, S3, S4}. An enable signal (EN) defines the state, i.e., which of the individual signals are activated. The current, I1, flowing on the current path whose transistor T1 is controlled by signal S1 is 1 µA. The currents I2, I3, and I4 flowing on the current paths with transistors T2, T3, and T4, respectively, are 1 µA, 2 µA, and 4 µA, respectively. Note that the embodiment 302 illustrated in FIG. 3 includes no current switch T1 adapted to turn ON and OFF current flowing on current path I1 in response to an S1 signal.

Returning to Table 1, for example, a first enable signal (EN1) may be defined as S1+S2+S3+S4. When turned ON, the transistors T1-T4 allow the associated current I1-I4 to flow, and when turned OFF, the transistor T1-T4 interrupts the current flowing on the associated current path. Thus, EN1 may cause all four transistors to be turned ON. In this case, the total current of 8 µA consists of a sum of currents I1, I2, I3 and I4 which flow through transistors T1-T4 when turned ON by the signals S1-S4. As noted, the current limits are user defined. If the designer chooses the resistive value, $R_{SET}$, as 93.75 kΩ, the current limit is set, per Table 1, at 75 mA. If the designer chooses the resistive value as 187.5 kΩ, the current limit is set at 150 mA. The designer may set the current limits, for example, based on one or more applications for the load switch device in which the current limit detector is to be incorporated.

The step-wise current limit detection may be obtained by, in a first step, activating all of S1-S4, causing the total detection current, $I_{SET}$, to initially be 8 µA. Thereafter, in a second step, S4 may be deactivated, causing the total current to be limited to 4 µA (i.e., to I1+I2+I3=1 µA+1 µA+2 µA). In a third step, S3 may be also deactivated, causing the total current to be limited to I1+I2, i.e., 2 µA. Further step-wise decrease may be obtained by deactivating S2 and thereafter S1, causing the current to be decreased to I1 (i.e., 1 µA) and thereafter to 0 µA or to substantially 0 µA (e.g., with bias currents alone or with no bias currents). Other step-wise decreases are possible. Various other sequences of step-wise decreases, and thus step-wise detection of the current limit, are possible. Such step-wise detection may further include various levels of step granularity or current increments.

Typically, an embodiment includes a single resistive device of a single resistive value. Therefore, typically only the parameters in one of the rows of Table 1 are applicable to any one embodiment. Other embodiments are possible. For example, an embodiment may include two or more resistive devices operating in parallel. Such embodiment may allow for a user application to select between the resistive devices via, for example, a select signal output from the user application.

The current limit detect and control component 312 may include delay elements FF1-FF3 (not shown in FIG. 3). The outputs of the delay elements FF1-FF3 may be fed to the current limit controller 306.

The delay elements FF1-FF3 may be operatively coupled to each other in series and operative to, serially, maintain a sequence of states. The output of a particular delay element (e.g., FF1) may be adapted to cause a change to the state of a delay element that follows it in the series (e.g., FF2). Each state may define which of the one or more transistors included in the current limit controller 306 are to be turned ON and which are to be turned OFF. The delay elements may be flip-flop registers (FFs). Examples of FFs include D-FFs and JK FFs.

Including the delay elements allows for the current limit detector 302 to remember a sequence of a length which is based on the number of FFs included. In the illustrated embodiment, the current limit detector 302 includes three FFs (i.e., FF1, FF2, and FF3) operatively coupled, for example, to COMP1, and thus the current limit detector is adapted to remember a sequence of length three (with respect to the operation of COMP1). In alternative embodiments, more or fewer delay elements may be included. As the number of delay elements increases, so does the length of the sequences that may be remembered and, in turn, the obtainable current resolution. For example, in an embodiment including the enable signal EN1 defined as in Table 1, the sequence of states allows for a step-wise decrease of $I_{SET}$ from a first state in which 8 µA (all of I1-I4) is flowing to a second state in which 4 µA (I1-I3 but not I4) is flowing and from the second to a third state in which 2 µA (I1 and I2 but not I3 and I4) is flowing.

Values, such as the 1.5 V reference voltage, i.e., the high threshold voltage (or state trip point) associated with COMP 1, the low reference voltage 0.75 V associated with COMP2, or both, may vary because of resistor tolerance (e.g., of one or more of the resistors R1-R3). Examples of resistor tolerance include 5%, 10%, and more. These values may further vary due to variations in rail voltage (i.e., voltage provided by the supply, such as the power supply 102). In the embodiment of FIG. 3, the rail voltage is 2.0 V.

Various configurations of the embodiments disclosed herein are possible. For example, the transistors (e.g., T2-T4, T10-T14) may include field effect transistors (FETs), such as junction FETs (JFETs), metal oxide semiconductor FETs (MOSFETs), or any combination thereof. The transistors may also include bipolar junction transistors (BJTs), in which case the earlier reference to gate (the term for FETs) corresponds to an emitter (the term for BJTs). The current limit portion 304 may include a resistor other than a current sensing resistor (e.g., $R_S$); however, in some configurations, this may result in less than optimal performance. For example, the power consumption may be less than optimally minimized, a higher number of components may need to be used, or the like. In some embodiments, the charge storage device 114 may be external to and adapted to cooperate with the load switch device 300.

The load switch device 300 or portions thereof may be implemented in a number of ways. It may be implemented using discrete components or, preferably, it may be embodied in an IC or as a functional block in an IC. Such IC may further be adapted for use in a mobile device. Examples of mobile devices include laptops, cell phones, personal digital assistants (PDAs), game boys, other battery-operated toys, and the like.

In sum, although the present invention has been described in considerable detail with reference to certain preferred versions thereof, other versions are possible. Therefore, the spirit and scope of the appended claims should not be limited to the description of the preferred versions contained herein.

What is claimed is:

1. A device for controlling current limits with a current limit detector, comprising:
    a current limit controller including a current switch, the current switch adapted to provide current from a power supply;
    a current limit detector adapted to detect a user-defined current limit and to generate a signal associated with the user-defined current limit; and
    a current limit portion including an amplifier, a large scale transistor of a predetermined large scale and a small scale transistor of a predetermined small scale, the large scale transistor being in parallel with the current switch, a ratio between the predetermined large and small scales being preset to control a ratio between a small scale current and a large scale current flowing to the small and large scale transistors, respectively, from the power supply, the amplifier being adapted to perform desired biasing and regulating functions.

2. The device of claim 1 wherein the amplifier is adapted to bias a control terminal of the large scale transistor and bias a control terminal of the small scale transistor in response to a comparison of a first signal based on the small scale current and a second signal based on the signal from the current limit detector.

3. The device of claim 2 wherein the amplifier is adapted to regulate the current from the power supply by controlling the current switch of the current limit controller in response to the comparison of the first signal.

4. The device of claim 3 wherein the current limit controller includes a plurality of the current switches.

5. The device of claim 3 wherein biasing the control terminals of the large and small scale transistors results in reducing the small scale current to the user-defined current limit when the small scale current exceeds the user-defined current limit.

6. The device of claim 3 wherein biasing the control terminals of the large and small scale transistors results in increasing the small scale current until it substantially reaches the user-defined current limit when the small scale current is below the user-defined current limit.

7. The device of claim 1 wherein the amplifier is an operational amplifier that includes input terminals.

8. The device of claim 7 wherein the amplifier is further adapted to produce an output signal responsive to a differential input voltage applied at its input terminals for biasing the control terminals of the large and small scale transistors.

9. The device of claim 8 further comprising a resistor coupled to and interposed between the input terminals of the amplifier and adapted to allow a differential current to flow through the resistor.

10. The device of claim 9 wherein the differential current is based at least in part on the small and large scale currents.

11. The device of claim 10 wherein the differential current flowing through the resistor produces the differential input voltage.

12. The device of claim 11 wherein the resistor includes a current sensing resistor.

13. The device of claim 1 wherein the amplifier includes input terminals for biasing the control terminals of the large and small scale transistors, the amplifier being further adapted to produce an output signal responsive to a differential input voltage applied at its input terminals.

14. The device of claim 13 wherein the differential input voltage is proportional to a sum of the large and small scale currents.

15. The device of claim 3 wherein biasing the control terminals of the large and small scale transistors is carried out at a pace that depends on a gain of the amplifier.

16. The device of claim 3 further comprising a current limit converter coupled to the output terminal of the small scale transistor.

17. The device of claim 1 embodied in an integrated circuit (IC).

18. The device of claim 17 wherein the IC is adapted for use in a mobile device.

19. The device of claim 16 wherein the current limit converter is operative to convert the small scale current to voltage.

20. The device of claim 17 embodied as a functional block on the IC.

21. The device of claim 1 wherein the current switch has a scale different from the predetermined large scale.

22. The device of claim 1 wherein the current limit detector includes one or more scaled current limit switches, one of the scales of the one or more scaled current limit switches corresponding to a scale of the current switch of the current limit controller.

23. A method for controlling current limits with a current limit detector, comprising:
  receiving current from a power supply;
  receiving, at a current limit portion including a current switch, a signal from a current limit detector, the signal being associated with a user-defined current limit;
  controlling a small scale current to maintain the small scale current substantially below the user-defined current limit by biasing a control terminal of a large scale transistor to regulate a large scale current and biasing a control terminal of a small scale transistor to regulate the small scale current, the large scale transistor being in parallel with the current switch; and
  regulating the current from the power supply in response to a comparison of a first signal based on the small scale current and a second signal based on the signal from the current limit detector.

24. The method of claim 23 wherein the large scale current and the small scale current include current flowing to, respectively, the large scale transistor and the small scale transistor in response to a differential of the large scale current and the comparison.

25. The method of claim 24 wherein a ratio between the small and large scale currents is preset based on a ratio between a predetermined scale associated with the small scale transistor and a predetermined large scale associated with the large scale transistor.

26. The method of claim 24 wherein biasing the control terminals of the large and small scale transistors results in reducing the small scale current to the user-defined current limit when the small scale current exceeds the user-defined current limit.

27. The method of claim 24 wherein biasing the control terminals of the large and small scale transistors results in increasing the small scale current until it substantially reaches the user-defined current limit when the small scale current is below the user-defined current limit.

28. The method of claim 24 wherein a differential input voltage is proportional to a difference between the large and small scale currents.

29. The method of claim 23 wherein biasing the control terminals of the large and small scale transistors is further responsive to a differential input voltage being applied at input terminals of an amplifier.

30. The method of claim 29 wherein biasing the control terminals of the large and small scale transistors is carried out at a pace that depends on a gain of the amplifier.

31. The method of claim 29 wherein the differential input voltage is proportional to a difference between the large and small scale currents.

32. The method of claim 31 wherein regulating the current from the power supply is based at least in part on an output signal from the amplifier.

33. The method of claim 23 wherein the current from a power supply is received using one or more scaled current switches, at least one of the scaled current switches having a scale different from the predetermined large scale.

34. The method of claim 33 wherein the current limit detector includes one or more scaled current limit switches.

35. The method of claim 34 wherein the scale of each of the one or more current limit switches corresponds to a respective scale of the one or more scaled current limit switches.

* * * * *